United States Patent
Liu et al.

(10) Patent No.: US 10,134,945 B1
(45) Date of Patent: Nov. 20, 2018

(54) WAFER TO WAFER BONDING TECHNIQUES FOR III-V WAFERS AND CMOS WAFERS

(71) Applicant: Taiwan Semiconductor Manufacturing Co., Ltd., Hsin-Chu (TW)

(72) Inventors: Ming Chyi Liu, Hsinchu (TW); Chen-Hua Yu, Hsinchu (TW); Chia-Shiung Tsai, Hsin-Chu (TW); Alexander Kalnitsky, San Francisco, CA (US); Ru-Liang Lee, Hsinchu (TW); Eugene Chen, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/688,200

(22) Filed: Aug. 28, 2017

(51) Int. Cl.
| | |
|---|---|
| *H01L 21/30* | (2006.01) |
| *H01L 21/46* | (2006.01) |
| *H01L 33/00* | (2010.01) |
| *H01L 21/762* | (2006.01) |
| *H01L 21/18* | (2006.01) |
| *H01L 21/285* | (2006.01) |
| *H01L 21/8258* | (2006.01) |

(52) U.S. Cl.
CPC ........ *H01L 33/0079* (2013.01); *H01L 21/185* (2013.01); *H01L 21/28575* (2013.01); *H01L 21/76251* (2013.01); *H01L 21/8258* (2013.01); *H01L 33/0095* (2013.01)

(58) Field of Classification Search
CPC ........... H01L 21/02008; H01L 21/0201; H01L 21/02019; H01L 21/2007; H01L 21/20; H01L 21/76251; H01L 21/76254; H01L 21/76259; H01L 21/76256; H01L 33/0079; H01L 21/185
See application file for complete search history.

(56) References Cited

U.S. PATENT DOCUMENTS

| | | | | |
|---|---|---|---|---|
| 7,875,952 | B1* | 1/2011 | Elliott | .................. H01L 21/8221 257/499 |
| 9,754,860 | B2* | 9/2017 | Molin | .................... H01L 23/481 |
| 2009/0297091 | A1* | 12/2009 | Assefa | ................ H01L 27/0688 385/14 |
| 2010/0181674 | A1 | 7/2010 | Tabatabie et al. | |
| 2014/0264400 | A1* | 9/2014 | Lipson | .................. H01L 27/144 257/88 |

\* cited by examiner

*Primary Examiner* — Thanh Y Tran
(74) *Attorney, Agent, or Firm* — Eschweiler & Potashnik, LLC

(57) ABSTRACT

A method for wafer to wafer bonding for III-V and CMOS wafers is provided. A silicon carrier wafer is provided having an epitaxial III-V semiconductor region and an oxide region disposed over the wafer top surface, the regions having substantially equal heights. A sidewall of the epitaxial III-V semiconductor region directly contacts a sidewall of the oxide region. A eutectic bonding layer is formed over a top surface of the epitaxial III-V semiconductor region and the oxide region for bonding to the CMOS wafer which contains semiconductor devices. The silicon carrier wafer is removed, and the CMOS wafer is singulated to form a plurality of three-dimensional integrated circuits, each including a CMOS substrate corresponding to a portion of the CMOS wafer and a III-V optical device corresponding to a portion of the III-V epitaxial semiconductor region.

20 Claims, 8 Drawing Sheets

Top view

WAFER TO WAFER BONDING TECHNIQUES FOR III-V WAFERS AND CMOS WAFERS

BACKGROUND

Semiconductor chips are used in all kinds of electronic and other devices and are well-known. Today's wide-spread use of such chips, and consumer demands for more powerful and more compact devices dictates that chip manufacturers continuously decrease the physical size and continuously increase the functionality of such chips. To shrink the chip footprint, manufacturers increasingly push to obtain smaller feature sizes and die sizes, resulting in a larger number of dies within a fixed wafer size. To shrink the height of the chips, manufacturers strive to create three-dimensional or stacked integrated circuits (3DIC's). Existing manufacturing methods for these stacked chips may be time consuming, such as the pick-and-place methods used to bond individual chips to other chips or to wafers. The higher the density of the dies in a given wafer size, the longer time such a bonding process consumes, which reduces the manufacturing output measured in wafers bonded per hour. Next generation fabrication methods are envisioned to integrate type III-V devices to Complementary Metal Oxide Semiconductor (CMOS) chips or to wafers, and to do so in a high reliability, high speed and footprint efficient manner.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
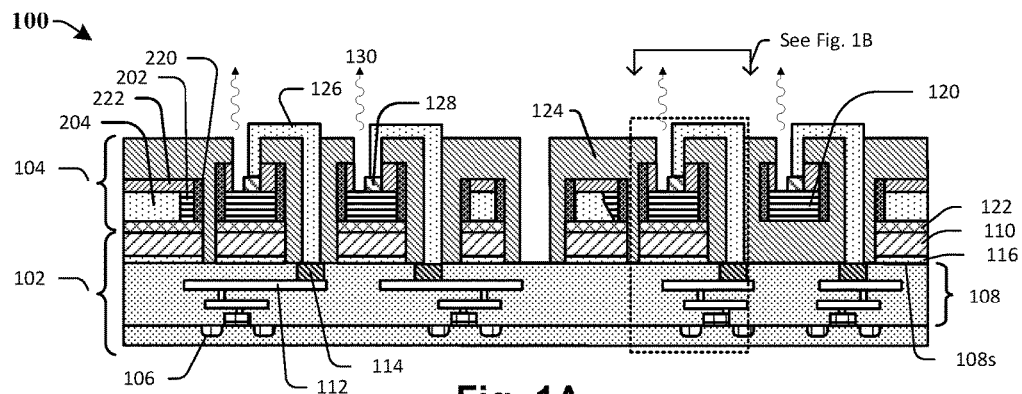
FIGS. 1A and 1B illustrate cross-sectional views of various embodiments of a semiconductor chip structure comprising a CMOS IC and an III-V IC derived from a wafer to wafer bonding method.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Currently known processes to integrate a type III-V die with a CMOS die may involve individually placing a number of type III-V dies or "stamps" upon a CMOS wafer and effecting a bond where they contact. Such a process is typically referred to as a "pick and place" process. One disadvantage of such a process is the amount of time it takes to individually bond each of the III-V dies or stamps over each corresponding die surface within the CMOS wafer. As feature sizes shrink, the die length and width become smaller and the number of die that may be fabricated within a fixed wafer size grows in a squared proportion to the smaller length and width of the die. For example, if a smaller feature size reduces both the length and width of the die to 80% of a previous value, the footprint of the die is reduced to 0.80×0.80 or 64% of its previous value. Therefore, a fixed wafer size may accommodate the inverse of 64% or about 1.56 times the number dies compared to the previous die footprint. Accordingly, the time required for pick and place bonding to be completed across the wafer grows in the same proportion, thereby reducing the wafer per hour output of the chip manufacturer.

Another disadvantage of such a process is that the alignment between the individual dies and the receiving substrate must be very accurately controlled to precisely match the desired features of the two components. Typically, an alignment mark may be provided on both the III-V die and the receiving die on the CMOS wafer to ensure bonding accuracy. However, the alignment marks occupy valuable footprint space without adding any additional functionality, at least partially defeating the desire to fabricate both smaller and higher functionality devices.

Another disadvantage of such a "pick and place" bonding process is that it introduces a step height change in topography between the stamp height of the bonded type III-V die and the CMOS wafer surface. Subsequent processing of the now integrated wafer, for example the deposition of hard mask oxide layers or photoresist layers to pattern the type III-V die, must now conform to the abrupt height changes at the edges or corners of the stamps. Inadequate adhesion of the photoresist layer (known as "lift-off" in some contexts) at these edges can occur. Additionally, the relatively tall height of the III-V die creates a large vertical thickness of materials that are deposited or grown on the sidewalls of the III-V die, which are resistant to vertically aligned etching techniques. The net effect may be defects in the patterning or in subsequent etching processes creating unintended structures such as an III-V fence or an oxide fence, or subsequent deposition of conductive materials in undesired locations.

In view of the foregoing, the present disclosure relates to devices and methods for accomplishing the integration of a type III-V wafer to a CMOS wafer to limit or avoid these noted deficiencies. Because aspects of this disclosure make use of wafer-to-wafer bonding (rather than conventional "pick and place" techniques), these disclosed techniques can exponentially reduce fabrication time compared to conventional approaches. Further, because each III-V die is no longer required to be individually aligned for "pick and placement" on a CMOS wafer, each individual III-V die can exhibit an absence of a "pick and place" alignment mark, and the same can be true for each CMOS die. This frees up room on the III-V die and CMOS die for additional functional circuitry, such that disclosed fabricated 3DICs, each of which includes a III-V die bonded to a CMOS die, exhibit a larger area of functional circuitry compared to conventional devices.

In view of the foregoing, the present application is directed toward fabrication of 3DIC's with application to optical devices and particularly to Vertical Cavity Surface Emitting Lasers (VCSEL's), where high throughput manufacturing and higher feature-density dies are achieved by CMOS wafer to III-V wafer bonding.

FIG. 1A illustrates a 3DIC semiconductor chip 100 derived by wafer to wafer bonding of a CMOS wafer to a III-V wafer. In some embodiments, the 3DIC semiconductor chip 100 includes a CMOS IC 102 and a III-V IC 104 which has been singulated from a CMOS wafer and a silicon carrier wafer which were bonded together.

The CMOS IC 102 may comprise a plurality of semiconductor devices 106, an interconnect structure 108 disposed over and electrically coupled to the semiconductor devices 106, and an adhesive bonding layer 110 disposed above the interconnect structure 108. In some embodiments, the interconnect structure 108 may comprise interconnect layers 112 (e.g., metal layers such as copper), and contact pads 114 that are disposed over and electrically coupled to the interconnect layers 112. In some embodiments, the contact pads 114 may comprise a metallic compound, such as copper or copper alloys, and may further comprise the same metallic compound as the interconnect layers 112.

To facilitate electrical and physical coupling between the CMOS IC 102 and the III-V IC 104, a conductive layer 116 may be disposed between the interconnect structure 108 and the adhesive bonding layer 110. In some embodiments, the adhesive bonding layer 110 may comprise an organic or an inorganic material, which may further comprise SU-8 or benzocyclobutene (BCB).

The III-V IC 104 may comprise an array of III-V semiconductor pillars 120 and a eutectic bonding layer 122 which bonds base portions of the III-V semiconductor pillars 120 to the adhesive bonding layer 110. In some embodiments, the eutectic bonding layer 122 comprises compounds of copper, gold, tin, or zinc. In some embodiments, an optional barrier layer may be disposed over the eutectic bonding layer 122, wherein the barrier layer (not shown) comprises compounds of titanium and nitrogen or compounds of tantalum and nitrogen.

A protective layer 124 extends partially over an upper surface of a III-V semiconductor pillar 120 and fills trenches between neighboring pillars to contact an upper surface 108s of the interconnect structure 108. In some embodiments, the protective layer 124 may comprise a potting material which may comprise a polyimide or a polyamide based material.

A metallic redistribution structure 126 is arranged in the trenches to electrically couple an upper surface of the III-V semiconductor pillar 120 to a contact pad 114 in the interconnect structure 108. The metallic redistribution structure 126 leaves an opening overtop the III-V semiconductor pillar 120 to allow light 130 to be selectively transmitted from the upper surface of the III-V semiconductor pillar 120 during operation, based on control signals provided by semiconductor devices 106. In some embodiments, the metallic redistribution structure 126 comprises a copper material. In some embodiments, the metallic redistribution structure 126 comprises the same metal as the conductive layer 116.

In some embodiments, the III-V semiconductor pillar 120 comprises a conductive pad 128 with a lower surface which is disposed over and electrically coupled to a portion of a top surface of the III-V semiconductor pillar 120, and wherein an upper surface of the conductive pad 128 is electrically coupled to the metallic redistribution structure 126. In some embodiments, the conductive pad 128 comprises a semiconductor material that is p-doped.

The III-V IC 104 further comprises an oxidation layer 204 that has upper and lower surfaces that are co-planar with upper and lower surfaces of the III-V semiconductor pillars 120. The III-V IC further comprises a III-V fence 202, that has upper and lower surfaces that are co-planar with the upper and lower surfaces of the III-V semiconductor pillars 120, and with vertical sidewalls wherein one sidewall contacts the oxidation layer 204 and the opposed sidewall contacts the spacer 220.

The III-V IC further comprises a hard mask 222. In some embodiments, the upper surface of the oxidation layer 204 contacts the lower surface of the hard mask 222. In some embodiments, the hard mask layer 222 is made of silicon nitride.

Figure 1B:
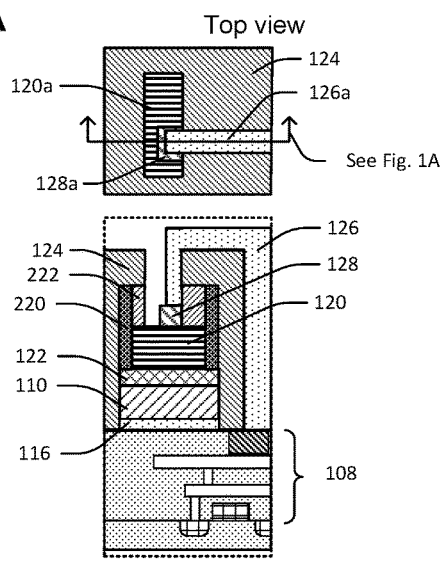

FIG. 1B illustrates a top view of a portion of the III-V IC 104 showing the metallic redistribution structure 126 leaving an opening overtop the III-V semiconductor pillar 120 to allow light to be transmitted from upper surface of the III-V semiconductor pillar 120. In some embodiments, the lower surface of the conductive pad 128 comprises a pad footprint area 128a in contact with a top surface area 120a of the III-V semiconductor pillar 120, wherein the top surface area 120a is greater than the pad footprint area 128a. In still some embodiments, the opening is comprised of the top surface area 120a minus a sum of the pad footprint area 128a plus a redistribution structure area 126a that overlaps a vertical projection of the top surface area 120a.

Figure 2B:
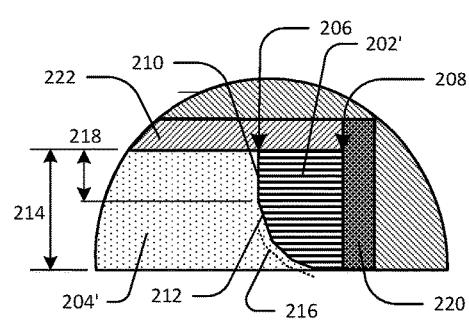
FIGS. 2A and 2B illustrate various views of some embodiments of a semiconductor chip structure comprising a shaped profile of a grown III-V semiconductor region that borders an oxidation region.
Figure 2A:
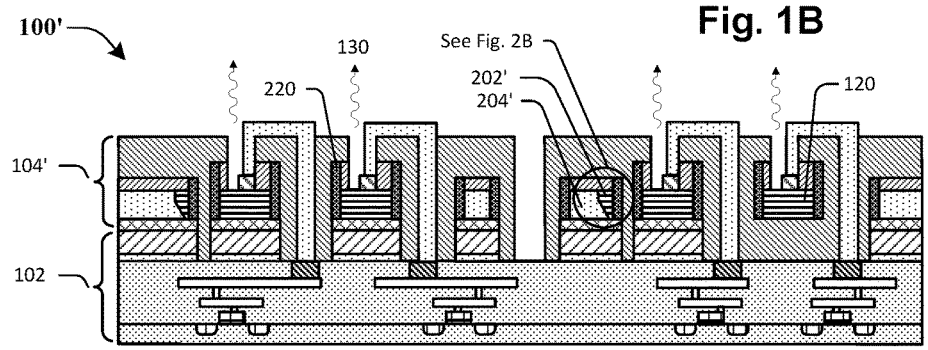

FIG. 2A illustrates some embodiments of a 3DIC semiconductor chip 100' wherein the III-V IC 104' also comprises an array of III-V fences 202' laterally spaced apart from the III-V semiconductor pillars 120. The III-V IC 104' further comprises an oxidation layer 204' that has upper and lower surfaces that are co-planar with upper and lower surfaces of the III-V semiconductor pillars 120 and the III-V fences 202'. The III-V IC 104' further comprises a first sidewall 206 of the III-V fence 202' that directly contacts a neighboring sidewall of the oxidation layer 204', and a second sidewall 208' of the III-V fence that directly contacts the spacer 220. Compared to FIGS. 1A-1B where the III-V fence has sidewalls that were planar and vertically oriented, the first sidewalls 206 in FIGS. 2A-2B have different profiles, such as tapered or rounded profiles.

In FIGS. 2A-2B, the first sidewall 206 of the III-V fence 202' comprises an upper segment 210 and a lower segment 212, wherein a top edge of the upper segment 210 is laterally spaced apart from a top edge of the second sidewall 208 by a first distance. The upper segment 210 extends vertically down to a height 218 that is less than the distance 214 between the upper and lower surfaces of the oxidation layer

204. The lower segment 212 extends with a rounded, tapered, or faceted profile 216 from a lower point of the upper segment down to the lower surface of the oxidation layer 204'. A bottom edge of the lower segment 212 is laterally spaced from a bottom edge of the second sidewall 208 by a second distance that is less than the first distance.

In some embodiments, the first sidewall 206 of the III-V fence 202' has a non-perpendicular edge that directly contacts a sidewall of the oxidation layer 204' having a conforming non-perpendicular edge.

In some embodiments, the upper segment 210 may extend vertically downward from a bottom surface of a hard mask layer 222. In some embodiments, the hard mask layer 222 is made of silicon nitride.

In some embodiments, the sidewalls of the III-V semiconductor pillar 120 and a second sidewall 208 of the III-V fence 202 are covered by a spacer 220 to effect electrical isolation from neighboring III-V semiconductor pillars. In some embodiments, the spacer 220 may comprise conformally coated materials that have been selectively and preferentially etched from horizontally disposed surfaces by a vertical etch-back process. In some embodiments, the conformally coated materials may comprise dielectric materials which may comprise silicon nitride and/or resins comprising acrylic resins, polyurethane resins, silicone resins, epoxy resins, or parylene resins.

Figure 3:
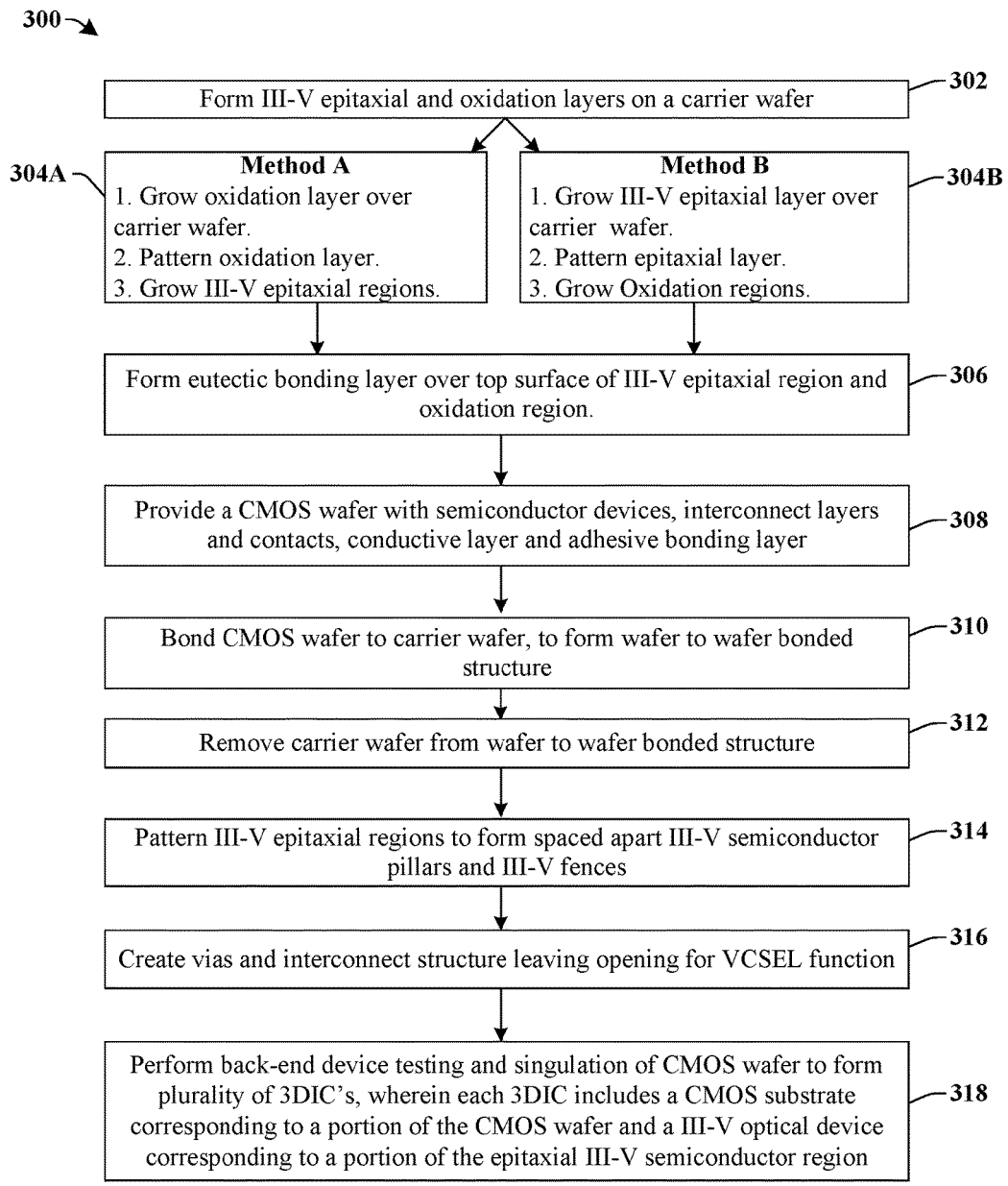
FIG. 3 illustrates a flowchart of an exemplary method of fabricating 3DIC's according to the present disclosure.

FIG. 3 illustrates a flowchart 300 of an exemplary method of fabricating the 3DIC for a VCSEL device using a wafer to wafer bonding method and according to the present disclosure.

At step 302, epitaxial III-V regions and oxidation regions are formed over a silicon carrier wafer. Step 302 can be carried out by two different techniques, 304A and 304B. In some embodiments and following step 304A, an oxidation layer is first grown over the silicon carrier wafer which may comprise a 12-inch diameter monocrystalline silicon wafer. The oxidation layer is selectively patterned, using for example, photolithography or similar methods, and etched down to the silicon carrier wafer creating trenches and exposed regions on the silicon carrier wafer. The epitaxial III-V regions are grown in the exposed regions 506A on the silicon carrier wafer, spanning the trench width and to a height substantially equal to the height of the oxidation layer. In some embodiments, the epitaxial III-V regions may be grown by performing a chemical vapor deposition (CVD) process.

In some embodiments in alternate step 304B, an epitaxial III-V layer is grown over a silicon carrier wafer. The epitaxial III-V layer is selectively patterned, and etched down to the silicon carrier wafer creating trenches and exposed regions on the silicon carrier wafer. The oxidation regions are grown in the exposed regions on the silicon carrier wafer, spanning the trench width, and to a height substantially equal to the height of the epitaxial III-V regions.

Prior to step 306, either step 304A or B may be followed by a planarization process by, for example a chemical or mechanical planarization process, to planarize the top surfaces of the epitaxial III-V regions and the oxidation regions.

At step 306, a eutectic bonding layer is formed over the planarized top surfaces of the epitaxial III-V regions and the oxidation regions. In some embodiments, the eutectic bonding layer comprises compounds of copper, gold, tin, or zinc. In some embodiments a barrier layer is disposed over the eutectic bonding layer. It some embodiments, the barrier layer comprises compounds of titanium and nitrogen or compounds of tantalum and nitrogen.

At step 308 a CMOS wafer is provided. The CMOS wafer may include a monocrystalline silicon carrier wafer, previously fabricated semiconductor devices, interconnect layers selectively deposited above the monocrystalline silicon substrate and electrically coupled to the semiconductor devices, and contacts selectively deposited above the interconnect layers and electrically coupled to the interconnect layers. In some embodiments a conductive layer is deposited above and electrically coupled to the contacts, and an adhesive bonding layer is deposited above and in direct contact with the conductive layer.

At step 310, the CMOS wafer is bonded to the silicon carrier wafer. In some embodiments, the CMOS and silicon carrier wafers are bonded together by joining the adhesive bonding materials in the adhesive bonding layer of the CMOS wafer to the eutectic bonding layer of the silicon carrier wafer. The adhesive and eutectic bonding materials can comprise any suitable materials known in the art.

In some embodiments, alignment indicators on each of the CMOS and silicon carrier wafers facilitate accurate alignment of the respective wafers. In some embodiments, a first alignment indicator is formed on the CMOS wafer within its scribe or edge regions, and not within its die regions. Similarly, a second alignment mark is formed on the silicon carrier wafer within its scribe or edge regions, and not within its die regions. In this manner, no die region space is consumed by any alignment indicators, and only a few indicators are needed to align one entire wafer to the other, yielding a larger die area per wafer for devices and other features as compared to pick and place or chip to wafer bonding methods. In some embodiments, the alignment can be performed by using an alignment mark detector that includes a laser diode and a photo detector to locate the position of the alignment marks.

In step 312, the silicon carrier wafer is stripped from the bonded structure revealing the underlying surfaces of the epitaxial III-V regions and the oxidation regions. Once the silicon carrier wafer is removed, the underlying surfaces of the epitaxial III-regions and the oxidation regions are generally co-planar and of equal height.

In step 314 the epitaxial III-V regions and the oxidation regions are selectively patterned and etched to form laterally spaced apart and isolated III-V semiconductor pillars and III-V fences. The etching process is continued down to the upper surface of the conductive layer leaving spaced apart pedestals of the eutectic bonding layer and the adhesive bonding layer directly beneath the III-V semiconductor pillars and the III-V fences. In some embodiments a first sidewall of the III-V fence directly contacts a neighboring sidewall of the oxidation region. In some embodiments, the upper and lower surfaces of the oxidation regions are coplanar with the upper and lower surfaces of the III-V semiconductor pillars.

In step 316, the vias and interconnect structures are formed to electrically connect the III-V semiconductor pillars with the semiconductor devices of the CMOS wafer to enable the operation of optical devices, such as VCSEL devices. A conductive pad is deposited on the top of the III-V semiconductor pillars. A via mask is formed and etched to form via trenches spaced apart from and between the III-V semiconductor pillars and positioned above a vertical projection of a top surface of the contacts within the CMOS wafer. The via trenches extend down to the upper surface of the conductive layer, and extend up to a via trench height that exceeds the conductive pad height.

Metal is deposited to fill the via trenches and to form vias electrically coupled to the conductive layer, and a chemical mechanical planarization (CMP) process is performed to a via height that is less than the via trench height and greater than the conductive pad height. A redistribution layer is formed by depositing a protective layer that fills between neighboring III-V semiconductor pillars and vias. The protective layer is patterned to form vertically oriented trenches that connect to the top surface of the conductive pads, and horizontally oriented trenches that connect the vertical trenches to the vias. Metal is deposited to fill the vertical and horizontal trenches, and planarized to form distinct electrical connections between the III-V semiconductor pillars and the semiconductor devices of the CMOS wafer.

In step 318, back-end optical device testing may be performed. The CMOS wafer may be singulated by methods known in the art yielding a plurality of 3DIC chips comprising VCSEL or related optical devices.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art upon reviewing this disclosure. The front-end processes noted can include forming shallow trench isolation (STI), forming wells, forming devices (e.g., transistors, capacitors, or resistors), forming interconnections, and/or any other suitable processes in some embodiments. The front-end processes can be performed by any suitable methods or processes known in the art.

FIGS. 4-28 illustrate an overview of the process to integrate a type III-V wafer to a CMOS wafer in accordance with some embodiments of the present disclosure.

Figure 4:
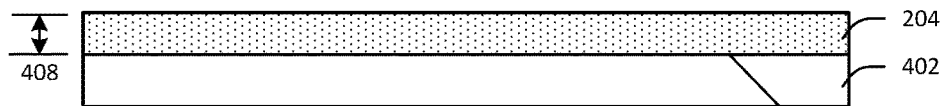
FIGS. 4 through 24 illustrate a series of cross-sectional views describing a method of fabricating 3DIC's according to the present disclosure.
Figure 5:
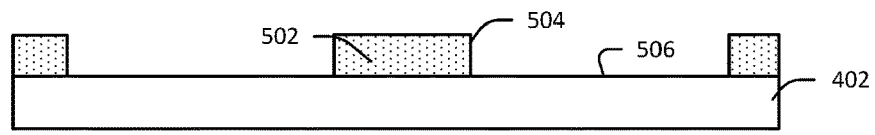

FIGS. 4-6 provide a non-limiting example of some embodiments of how step 304A of FIG. 3 may be carried out, but do not limit step 304A in any regards. FIG. 4 provides a cross-sectional view of a first approach for fabricating the type III-V wafer, which includes a plurality of III-V dies. A silicon carrier wafer 402 is provided with a first face 404 and a second face 406. An oxidation layer 204 is grown over the first face 404 of the silicon carrier wafer 402, wherein the oxidation layer 204 comprises a first oxide layer height 408. In some embodiments, the silicon carrier wafer 402 comprises a 12-inch diameter monocrystalline silicon wafer.

FIG. 5 illustrates selective patterning and etching of the oxidation layer 204, using, for example, photolithography or similar methods. The etching process creates trenches extending down to the first face 404 of the silicon carrier wafer 402, and the trenches leave the oxidation regions 502 with oxidation region sidewalls 504. The etching process further creates exposed regions 506 on the first face 404 of the silicon carrier wafer.

Figure 6A:
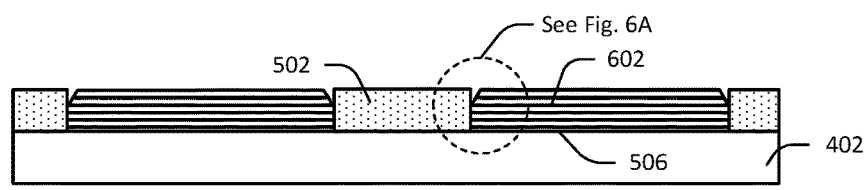

FIG. 6A illustrates growing an epitaxial III-V semiconductor layer 602 over the exposed regions 506 that were exposed by the etching process. The epitaxial III-V semiconductor layer 602 spans the width of the trenches at least partially contacting the oxidation region sidewalls 504.

In some embodiments, the epitaxial III-V semiconductor layer 602 comprises a type III-V semiconductor material. In some embodiments, the epitaxial III-V semiconductor layer 602 has a height, as measured at a point about mid-span of the trench width, which is substantially equal to the first oxidation layer height 408 of the oxidation regions 502. In some embodiments, a planarization step, such as chemical or mechanical machining, may be employed to cause the height of the epitaxial III-V semiconductor layer 602 to be substantially equal to the height of the oxidation regions 502. In some embodiments, the epitaxial III-V semiconductor layer may be grown by CVD methods.

Figure 6B:
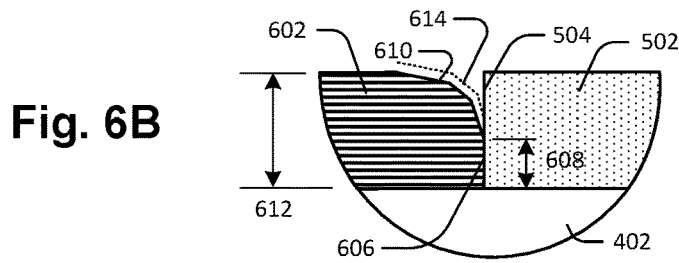

In some embodiments and as shown in FIG. 6B, the growing of the epitaxial III-V semiconductor layer 602 forms a lower EPI sidewall 606 having a first height 608 as measured from the first face 404 of the silicon carrier wafer 402 and wherein the lower EPI sidewall 606 is in contact with the oxidation region sidewall 504, and an upper EPI sidewall 610 having a second height that extends from the first height to a mid-span height 612 of the epitaxial III-V semiconductor layer, and wherein the upper EPI sidewall 610 is spaced from the oxidation region sidewall 504.

In some embodiments as shown in FIG. 6B, the upper EPI sidewall has top corners 614 that border the sidewalls of the oxidation region 502, wherein the top corners 614 have a cross-sectional profile that is rounded, angled, or faceted and that continuously and monotonically transitions between the top surface of the epitaxial III-V semiconductor layer 602 and a top edge of the lower EPI sidewall 606.

Figure 7:
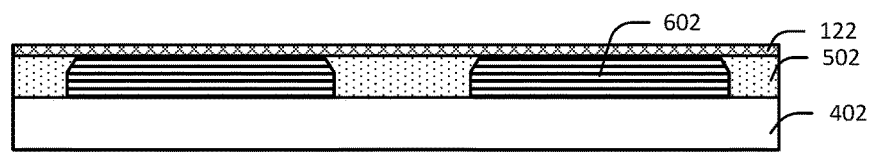

FIG. 7 provides a cross-sectional view of a subsequent processing step, where a eutectic bonding layer 122 is deposited over the upper most surfaces of the epitaxial III-V semiconductor layer 602 and the oxidation regions 502. FIG. 7 provides a non-limiting example of some embodiments of how step 306 of FIG. 3 may be carried out, but does not limit step 306 in any regards. In some embodiments and prior to the deposition of the eutectic bonding layer 122, an additional oxidation layer may be first deposited over the uppermost surfaces of the epitaxial III-V semiconductor layer 602 and the oxidation regions 502. The additional oxidation layer may fill any cavities that may exist between the upper EPI sidewall 610 and the oxidation region sidewall 504 of the oxidation region 502, and builds up to an additional height covering the epitaxial III-V semiconductor layer and the oxidation regions. This additional oxidation layer is then planarized by, for example, chemical or mechanical machining, to re-expose the top surface of the epitaxial III-V semiconductor layer 602 and the oxidation regions 502.

In some embodiments, a barrier layer may be deposited over the eutectic bonding layer 122. The barrier layer may comprise compounds of titanium and nitrogen, or compounds of tantalum and nitrogen. In some embodiments the eutectic bonding layer 122 may comprise compounds of copper, gold, tin, or zinc.

Figure 8:
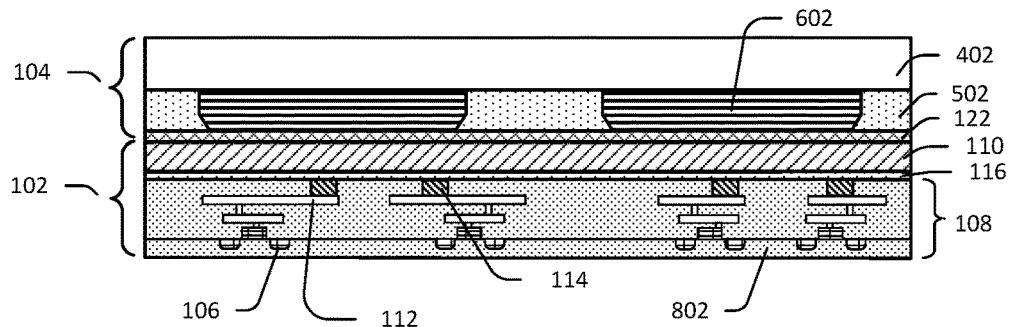

FIG. 8 depicts the structure as pictured in FIG. 7, except it has been flipped about a horizontal axis such that the eutectic bonding layer 122 is now facing down, and it has been bonded to a CMOS IC 102, which includes a silicon wafer 802 having semiconductor devices 106. In some embodiments, the silicon wafer 802 may be referred to as a CMOS wafer and/or CMOS substrate, depending for example, upon the stage of fabrication. Thus, FIG. 8 provides a non-limiting example of some embodiments of how step 310 of FIG. 3 may be carried out, but does not limit step 310 in any regards. Interconnect layers 112 are deposited above and electrically coupled to the semiconductor devices 106. Contact pads 114 are deposited above and electrically coupled to the interconnect layers 112. A conductive layer 116 is deposited above and electrically coupled to the contact pads 114. An adhesive bonding layer 110 is deposited above and in direct contact with the conductive layer 116. In some embodiments, the adhesive bonding layer 110 comprises an adhesive material or an electrically insulating material. In some embodiments, the conductive layer 116 comprises a metal or copper. In some embodiments, the CMOS wafer (CMOS IC) 102 is bonded to the silicon carrier wafer 402 by the adhesive bonding layer 110 being in direct contact with the eutectic bonding layer 122.

Figure 9:
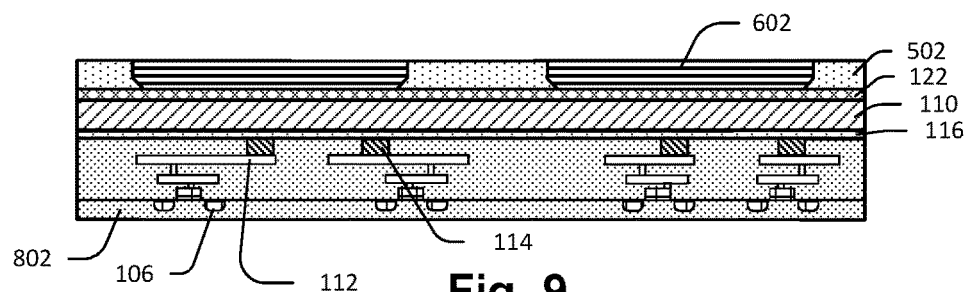

FIG. 9 illustrates a planarization step where the silicon carrier wafer 402 is removed, and thus provides a non-limiting example of some embodiments of how step 312 of FIG. 3 may be carried out, but does not limit step 312 in any regards. In some embodiments, the silicon carrier wafer 402 may be removed by, for example, a chemical mechanical planarization (CMP) step, a grinding step, or a de-bonding step. In some embodiments, the CMP step may further reduce the height of the epitaxial III-V semiconductor layer 602 and the oxidation regions 502.

Figure 10:
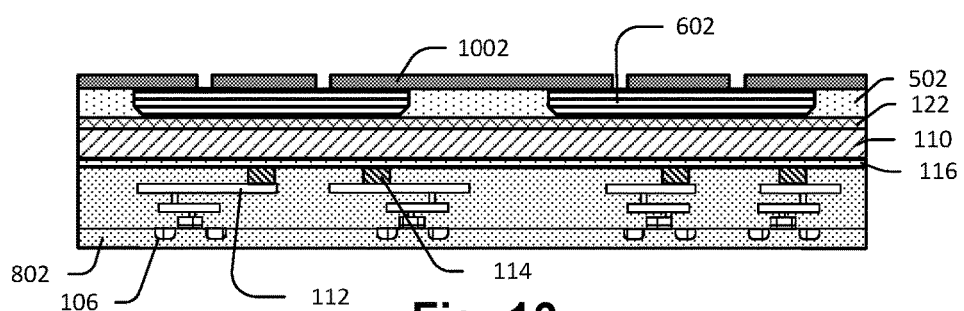

FIGS. 10-14 provide a non-limiting example of some embodiments of how step 314 of FIG. 3 may be carried out, but do not limit step 314 in any regards. FIG. 10 illustrates the steps of depositing and patterning a dielectric layer above the epitaxial III-V semiconductor layer 602 and the oxidation regions 502. In some embodiments, the dielectric layer is selectively patterned, for example, by photolithography methods to provide a patterned dielectric material 1002. In some embodiments, the continuous and planar topography of the upper surface of the epitaxial III-V semiconductor layer 602 and the oxidation regions 502 facilitates even deposition of the dielectric material and the photoresist layer, and additionally facilitates adhesion of the photoresist layer especially above the outermost edges of the epitaxial III-V semiconductor layer 602 and the adjoining edges of the oxidation region 502. By comparison, in previous approaches that did not include the oxidation region 502, there was a large step height at edges of the epitaxial III-V semiconductor layer 602, which could lead to unintended lift-off of the photoresist.

Figure 11:
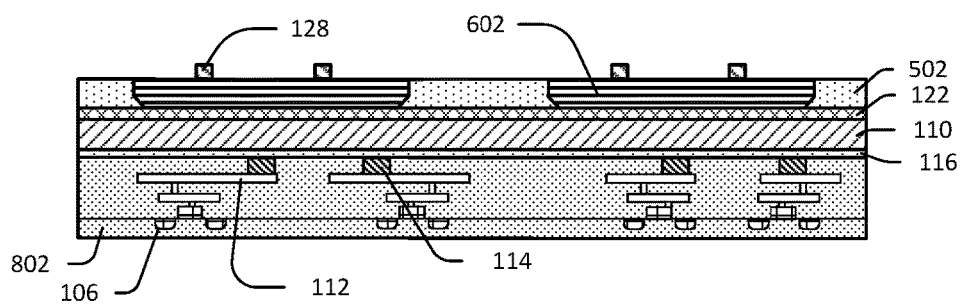

FIG. 11 illustrates deposition of conductive pad 128 within the cavities created by the patterned dielectric material 1002, and in direct contact with the epitaxial semiconductor layer 602. In some embodiments, a p-doped semiconductor material may be grow or deposited on the top surface of the structure as depicted in FIG. 10, filling the cavities to a height that exceeds the height of the patterned dielectric material 1002. In some embodiments, the p-doped semiconductor may be deposited, for example, by CVD methods. A CMP process may be performed to remove p-doped semiconductor material over the patterned dielectric material 1002 and leaving the p-doped semiconductor material filling the cavities and in contact with the epitaxial III-V semiconductor layer 602. Stripping of the patterned dielectric material 1002 leaves the conductive pads 128. In some embodiments, the patterned dielectric material 1002 may be stripped by methods comprising organic stripping, inorganic stripping, or dry stripping using etching techniques comprising plasma etching.

Figure 12:
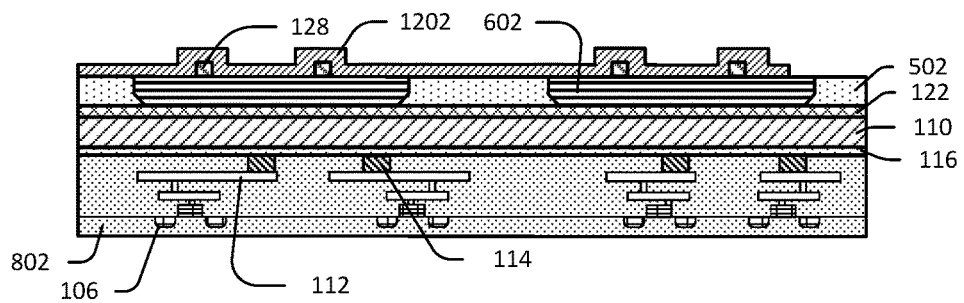

FIG. 12 illustrates depositing a hard mask layer 1202 over the epitaxial III-V semiconductor layer 602, the oxidation regions 502, and the conductive pads 128. In some embodiments, the hard mask layer 1202 may comprise an organic or an inorganic material. Organic materials may comprise amorphous carbon or siloxane based materials. Inorganic materials may comprise silicon nitride based compounds and titanium nitride based compounds. In some embodiments, the hard mask layer 1202 may be deposited by methods comprising CVD processes and/or spin-on processes.

Figure 13:
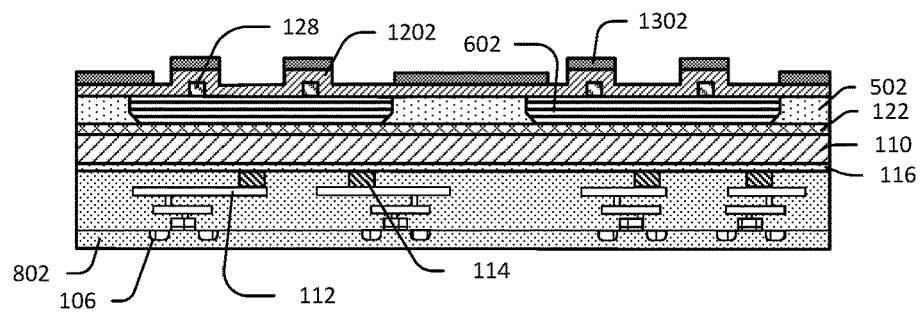
Figure 14:
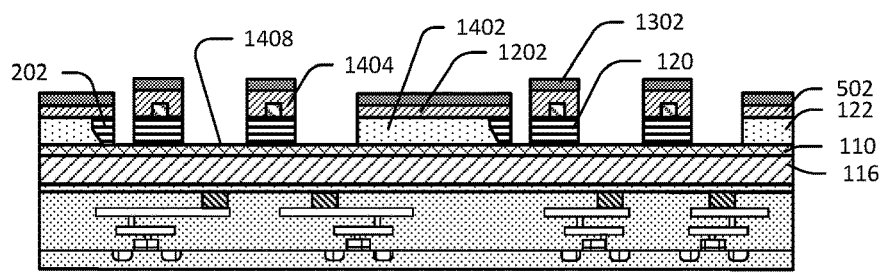

FIGS. 13 and 14 illustrate fabrication of the III-V semiconductor pillars within the epitaxial III-V semiconductor layer 602. FIG. 13 illustrates the process where the hard mask layer 1202 has been coated with a photoresist layer, which has subsequently been selectively developed, for example, by photolithographic methods. Once developed, the exposed photoresist is stripped forming the photoresist mask 1302.

FIG. 14 shows that, in some embodiments, the top surface of the structure is subjected to a vertical etching process using the mask 1302, to form trenches that stop at the eutectic bonding layer 122. This etch process creates spaced apart III-V semiconductor pillars 120 within a mesa-type structure, where the mesa structure has mesa top surfaces and mesa sidewalls. The etch process also creates the III-V fences 202, the oxidation mesa 1402, the hard mask caps 1404, and exposes open regions 1408 on an upper surface of the eutectic bonding layer and adjacent to the III-V semiconductor pillars 120. In some embodiments, the III-V fences 202 may be created at both the inner edges as well as the outer edges of the former epitaxial III-V semiconductor layer 602.

Figure 15:
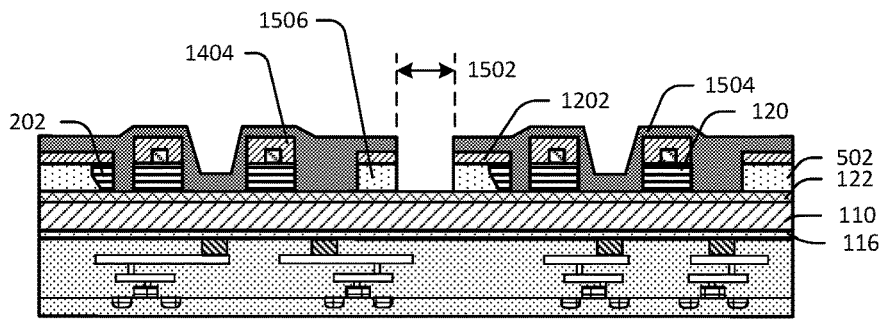

FIGS. 15-19 provide a non-limiting example of some embodiments of how step 316 of FIG. 3 may be carried out, but do not limit step 316 in any regards. FIG. 15 illustrates a subsequent process step for the removal of a field open width 1502 of the oxidation region 502. The uppermost surfaces of structure are first coated with a photoresist layer which is subsequently selectively developed, for example, by photolithographic methods. The exposed photoresist material is stripped, creating the photoresist mask 1504. The structure is subjected to a vertical and selective etching process that etches away the hard mask layer 1202 and the underlying oxidation region 502 within the field open width 1502, and stops at the eutectic bonding layer 122. Subsequently, the photoresist layer is chemically or physically removed. The resulting structure exposes sidewalls in the oxidation region that borders the field open width 1502, creating oxidation pedestals 1506.

Figure 16:
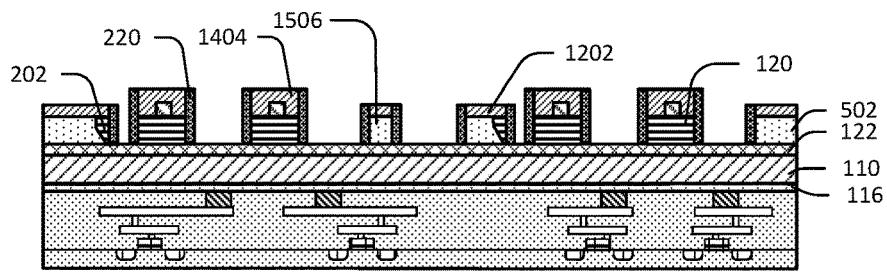

FIG. 16 illustrates the development of spacers 220 covering the exposed sidewalls of the III-V fences 202, the III-V semiconductor pillars 120, and the oxidation pedestals 1506. In some embodiments, the spacers 220 may be developed by, for example, first depositing a conformal coating across the uppermost surface of the structure. In some embodiments, the conformal coating may comprise a dielectric material, and may further comprise a nitride compound. Following deposition, the conformal coating may be etched by a vertically selective etch process whereby the etch may be maintained for a period of time to remove the horizontally facing surfaces, then stopped, and thereby effectively preserving the vertically oriented surfaces creating the spacers 220 comprised of conformal coating material. In some embodiments, the conformal coating material may comprise silicon nitride, or resins such as acrylic resins, polyurethane resins, silicone resins, epoxy resins, or parylene resins.

Figure 17:
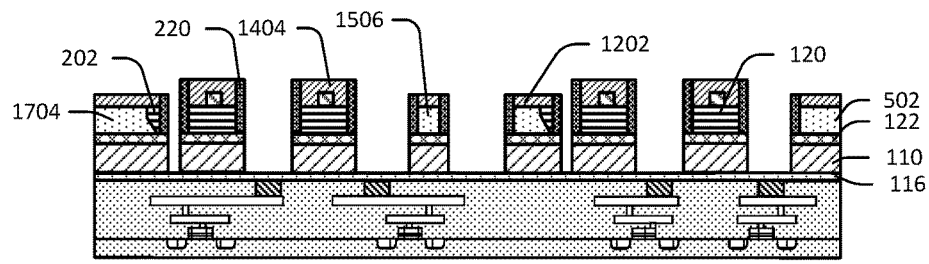

FIG. 17 illustrates the selective etching of the eutectic bonding layer 122 and the adhesive bonding layer 110 down to the conductive layer 116. In some embodiments, the uppermost surfaces of the structure comprise hard mask caps 1404, remaining regions of hard mask 1202, and upper surfaces of spacers 220 which may comprise a nitride. As such, a materially selective and vertically oriented etch may be performed which removes portions of the eutectic bonding layer 122 and the adhesive bonding layer 110 in regions that are not shielded by the hard mask caps 1404, the hard mask 1202, and the upper surface of the spacers 220. In some embodiments, an etch process is continued until the depth of removed material reaches the conductive layer 116. Because of the presence of the hard mask caps 1404 and spacers 220, this etch process is often carried out without the need for patterning of a separate photoresist mask, which can reduce costs relative to other implementations.

In some embodiments, the etching of the eutectic bonding layer forms first and second eutectic bonding regions disposed directly under the III-V semiconductor pillars 120 and the III-V fences 202, respectively, the first and second eutectic bonding regions joining base portions of the III-V semiconductor pillars 120 and the III-V fences 202 to the adhesive bonding layer 110, and wherein the second eutectic bonding region is underneath and in direct contact with an oxidation region 1704.

Figure 18:
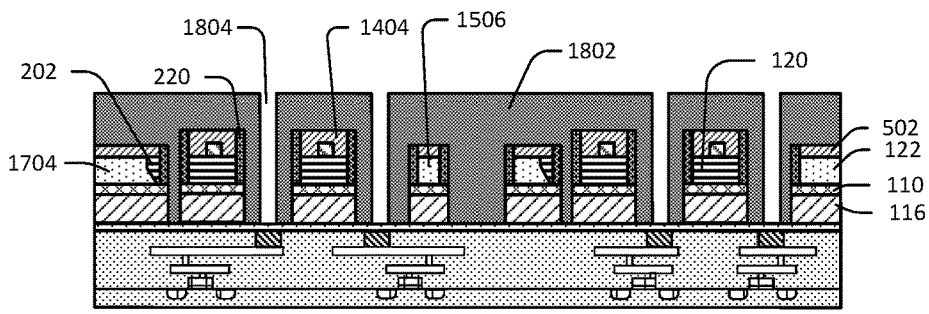

FIG. 18 illustrates the development of vias that electrically couple to the semiconductor devices 106 of the CMOS wafer. In some embodiments, the uppermost surface of the structure and the cavities between III-V semiconductor pillars 120 and oxidation pedestals 1506, including the top surface of the conductive layer 116, may be covered with a dielectric layer having a height that exceeds the height of the maximum height of an underlying structure such as the hard mask caps 1404. The dielectric layer may be subsequently patterned by photolithography methods to establish a patterned dielectric structure 1802. The patterned dielectric structure 1802 includes cavities 1804 that are vertically oriented and selectively arranged over a vertical projection of the upper surface of the contact pads 114.

Figure 19:
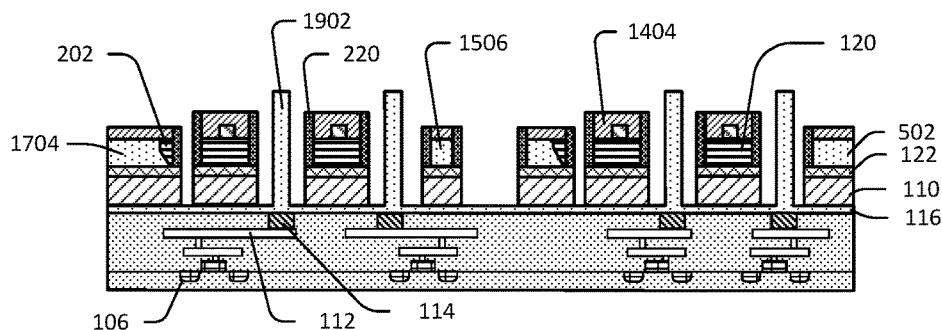

FIG. 19 illustrates the deposition of conductive materials such as metals into the cavities 1804. In some embodiments, conductive materials may be deposited or grown within the cavities 1804 and over the exposed upper surfaces of conductive layer 116 creating the vias 1902. In some embodiments, the deposition of conductive materials may comprise sputtering, electroplating or electroless plating, particle vapor deposition, and chemical vapor deposition. In some embodiments, the conductive materials may comprise alloys of copper, gold, palladium, or aluminum. Once the vias 1902 are deposited, CMP is carried out to planarize the upper surface of the vias 1902, and the patterned dielectric structure 1802. The patterned dielectric structure 1802 may be removed leaving the vias 1902 as free standing.

Figure 20:
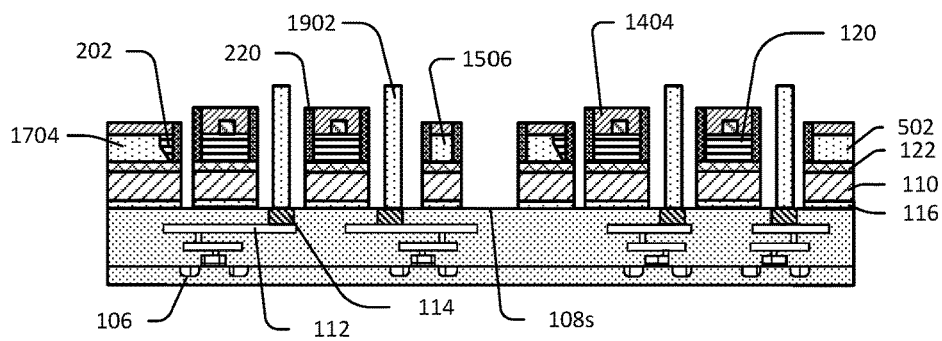

FIG. 20 illustrates selective removal of portions of the conductive layer 116 by a selective wet-etch process. In some embodiments, the uppermost surfaces of the structure comprise hard mask caps 1404, remaining regions of hard mask 1202, upper surfaces of spacers 220 which may comprise a nitride, and upper surfaces of the vias 1902. As such, a materially selective and vertically self-aligned wet-etch may be performed which removes laterally exposed portions of the conductive layer 116. In some embodiments, the etch process stops when the depth of the etch reaches the upper surface 108s of the interconnect structure 108. Such an etching process selectively removes portions of the conductive layer 116 such that the vias 1902 are electrically isolated from selected and adjacent portions of the conductive layer 116.

Figure 21:
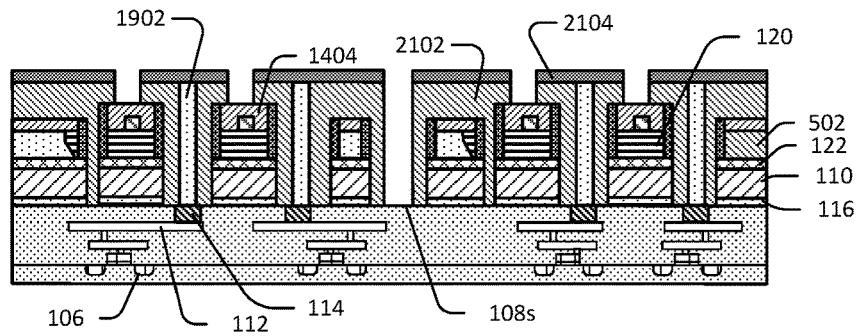

FIG. 21 illustrates deposition of a potting material 2102 to effect better electrical isolation between the vias 1902 and other neighboring features. In some embodiments, the potting material 2102 may be deposited to a height that exceeds the height of any other feature such as the vias 1902. Following deposition, the uppermost surface of the potting material 2102 may be subjected to a CMP process to planarize the surface and to expose the top of the vias 1902. Following planarazation, the height of the planarized surface may still exceed the height of a maximum height of an underlying feature such as the hard mask caps 1404. In some embodiments, the potting material 2102 may correspond to a protective layer, and may comprise coating which may comprise a polyamide or a polyimide material.

Following the CMP process, a photoresist layer may be deposited across the top of the planararized surface and selectively developed, for example, by photolithography methods. Once developed, the exposed photoresist is stripped forming the photoresist mask 2104. The upper surface of the structure is then subjected to a vertical etch process which selectively removes the potting material 2102 down to the top surface of the hard mask caps 1404, or down to the upper surface 108s of the interconnect structure 108.

Figure 22:
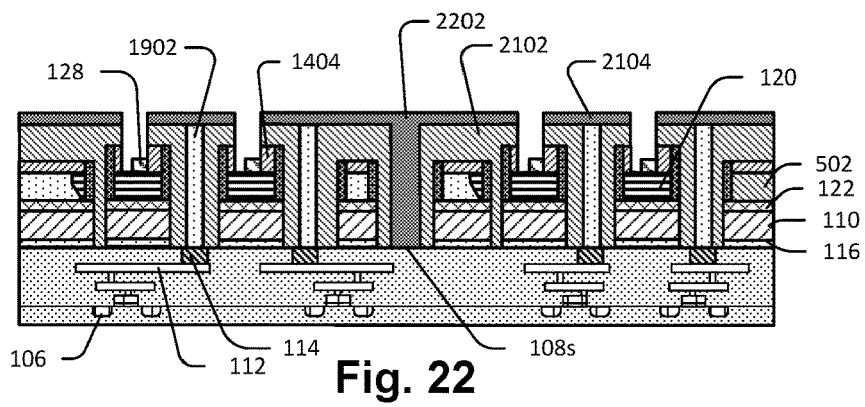
Figure 23:
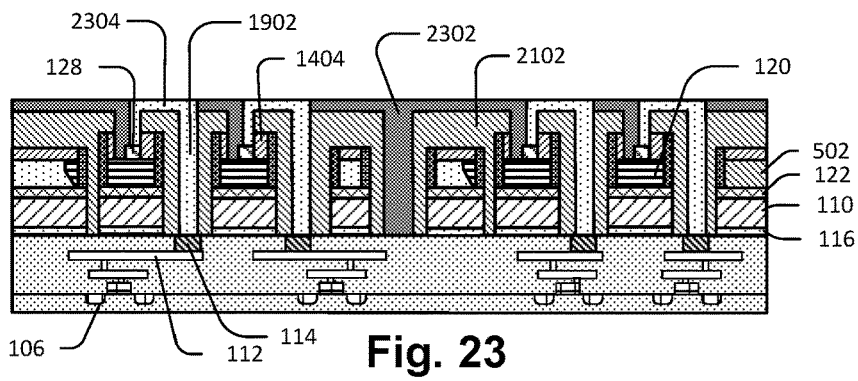
Figure 24:
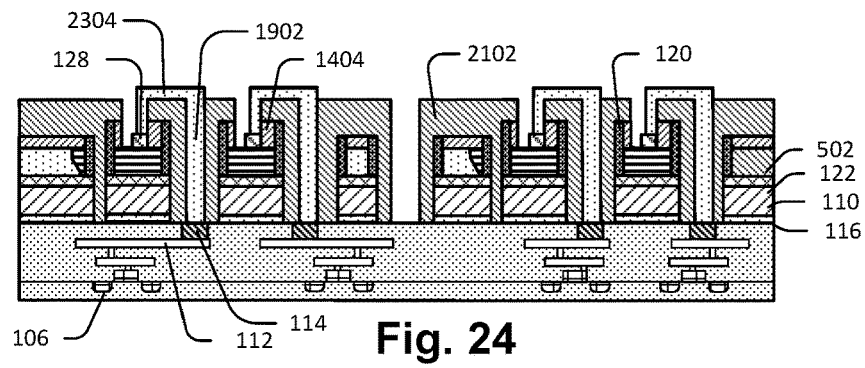

FIGS. 22 through 24 illustrate the completion of the VCSEL device. FIG. 22 shows the top of the hard mask caps 1404 may be partially removed by a selective vertical etch process which exposes the top surface of the conductive pad 128. In some embodiments, a photoresist layer may be deposited across the top surface of the structure, selectively developed by, for example, photolithography methods, and the exposed photoresist material then stripped creating the photoresist mask 2202. Subjecting the structure to a vertical etch process selectively removes the top surface of the hard mask caps 1404 to reveal the top surface of the conductive pad 128. Following the vertical etching process, the photoresist mask 2202 may be stripped.

FIG. 23 illustrates the fabrication steps of creating the conductive redistribution layer that electrically couples the conductive pad 128 with the vias 1902 that are electrically coupled to the semiconductor devices 106. In some embodiments, a dielectric layer may be deposited over the top surface of the structure, selectively patterned by, for example, photolithography methods. Subjecting the structure to an etching process selectively removes protective layer material to form vertical connection trenches that expose the top surface of the conductive pads, and to form horizontal connection trenches that connect the vertical trenches to the vias. The horizontal connection trenches comprise upper and lower surfaces and an upper surface height and a lower surface height. The etched structure creates a mold cavity for conductive materials to be formed to create the redistribution layer (RDL) 2304 that electrically connects the conductive pads 128 to the previously fabricated vias 1902. After being formed, for example, by sputtering, electroless plating, or other suitable methods, CMP is carried out to planarize the upper surfaces of the RDL 2304.

In some embodiments, the conductive materials may comprise alloys of copper, gold, palladium, or aluminum. In some embodiments, the conductive material is of the same type as that of the vias 1902, and it merge with the vias 1902. The redistribution layer may comprise a vertical connecting trench that electrically connects with the conductive pad 128, and it may also comprise a horizontal connecting trench that electrically connects with the top of the vias 1902.

FIG. 24 illustrates the completed structure, where the dielectric layer 2302 has been removed. Such a structure may be applicable to wafer to wafer bonding of a type III-V wafer to a CMOS wafer. Such a structure may also be applicable to laser devices, such devices comprising VCSEL's.

Figure 25:
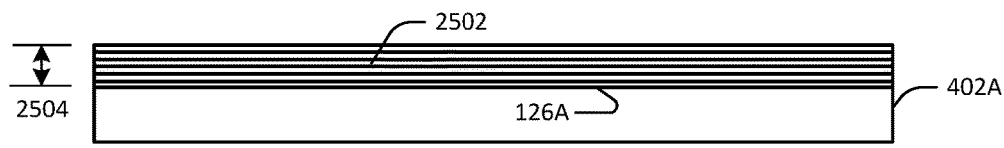
FIGS. 25 through 28 illustrate an alternative method for fabricating oxidation and epitaxial regions upon a wafer carrier according to the present disclosure.

FIGS. 25-29 illustrate an alternate process for forming epitaxial III-V semiconductor regions over a silicon carrier wafer to arrive at a similar configuration as shown on FIG. 9. Thus, FIGS. 25-28 provide a non-limiting example of some embodiments of how step 304B of FIG. 3 may be carried out, but do not limit step 304B in any regards. FIG. 25 depicts growing an epitaxial III-V semiconductor layer 2502 over the silicon carrier wafer 402A, wherein the epitaxial III-V semiconductor layer 2502 comprises an EPI layer height 2504. In some embodiments, the silicon carrier wafer may comprise a 12-inch diameter monocrystalline silicon wafer, and the epitaxial III-V semiconductor layer may comprise a type III-V semiconductor material.

Figure 26:
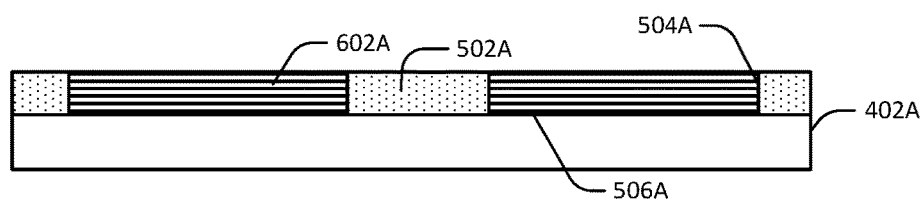

FIG. 26 depicts a cross-sectional view after further processing to create trenches in the epitaxial III-V semiconductor layer 2502 extending to the silicon carrier wafer 402A, and creating epitaxial III-V semiconductor regions 602A within the epitaxial III-V semiconductor layer 2502, and growing or depositing oxidation layers 502A within the trenches. In some embodiments, the epitaxial III-V semiconductor layer 2502 has been selectively patterned using, for example, photolithography or similar methods. The epitaxial III-V semiconductor layer 2502 has subsequently been selectively etched, with the etching process creating trenches and trench sidewalls extending down to the top surface 126A of the silicon carrier wafer 402A. An oxidation layer 502A has been grown or deposited in the regions 506A of the top surfaces 126A that were exposed by the etching process, and it spans the width of the trenches at least partially contacting the epitaxial III-V semiconductor layer sidewalls 504A.

In some embodiments, the height of the oxidation layer 502A, as measured at a point about mid-span of the trench width, is substantially equal to the height of the epitaxial III-V semiconductor regions 602A. In some embodiments, a planarization step, such as chemical or mechanical machining, may be employed to reduce the height of the epitaxial III-V semiconductor regions 602A and the oxidation layer 502A to a common height that is less than the EPI layer height 2504.

Figure 27:
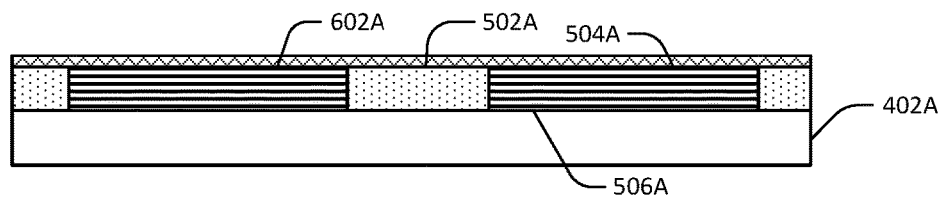

FIG. 27 illustrates that a eutectic bonding layer 122A is deposited over the uppermost surfaces of the epitaxial III-V semiconductor regions 602A and the oxidation layer 502A. In some embodiments, a barrier layer may be deposited over the eutectic bonding layer. In some embodiments, the barrier layer comprises compounds of titanium and nitrogen, or compounds of tantalum and nitrogen. In some embodiments the eutectic bonding layer 122A comprises copper, gold, tin, or zinc. The structure as depicted in FIG. 27 is now similar in construction to the structure previously depicted in FIG. 7, but absent the top corners 614 as shown in FIGS. 6A and 6B.

Figure 28:
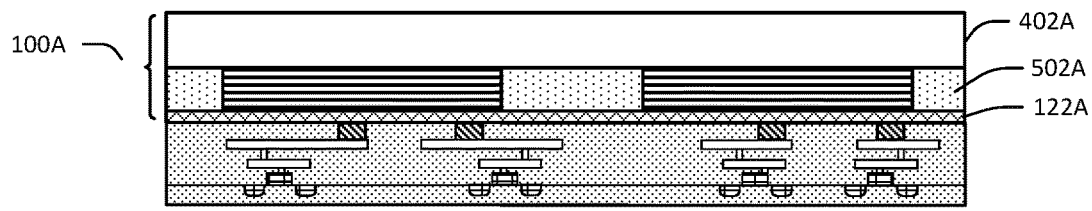

FIG. 28 illustrates a cross-sectional view of the silicon carrier wafer as shown in FIG. 27, except the structure has been flipped about a horizontal axis such that the eutectic bonding layer 122A is now the lowermost element of the structure rather than the uppermost, and the structure has been bonded to the CMOS wafer. Processing of the structure shown in FIG. 28 may continue following the depictions and descriptions above related to FIGS. 9 through 24, with the structure 100A being substituted directly for the semiconductor chip 100.

In view of the foregoing, some embodiments of the present application provide for a method comprising providing a silicon carrier wafer having a first face and a second face, wherein an epitaxial III-V semiconductor region and an oxide region are disposed on the first face and have substantially equal heights as measured from the first face of the silicon carrier wafer, and wherein a sidewall of the epitaxial III-V semiconductor region contacts a sidewall of the oxide region. The method further comprises forming a eutectic bonding layer over a top surface of the epitaxial III-V semiconductor region and the oxide region, bonding a CMOS wafer to the eutectic bonding layer, and removing the silicon carrier wafer after the bonding. The method further comprises singulating the CMOS wafer to form a plurality of three-dimensional integrated circuits (3DICs), wherein each 3DIC includes a CMOS substrate corresponding to a portion of the CMOS wafer and a III-V optical device corresponding to a portion of the III-V epitaxial semiconductor region.

Further, some embodiments of the present application provide for a semiconductor chip comprising a CMOS IC comprising a plurality of semiconductor devices, an interconnect structure disposed over and electrically coupled to the semiconductor devices, and an adhesive bonding layer disposed above interconnect structure. The semiconductor chip further comprises a III-V IC comprising an array of III-V semiconductor pillars, and a eutectic bonding layer which bonds base portions of the III-V semiconductor pillars and to the adhesive bonding layer, wherein a protective layer extends partially over an upper surface of a III-V semiconductor pillar and fills trenches between neighboring pillars to contact an upper surface of the interconnect structure. The semiconductor chip further comprises a conductive redistribution structure arranged in the trenches to electrically couple an upper surface of the III-V semiconductor pillar to a contact pad in the interconnect structure. The conductive redistribution structure leaves an opening overtop the III-V semiconductor pillar to allow light to be transmitted from the upper surface of the III-V semiconductor pillar.

Further, some embodiments of the present application provide for a semiconductor chip comprising a CMOS IC comprising a plurality of semiconductor devices, an interconnect structure disposed over and electrically coupled to the semiconductor devices, a conductive layer disposed over the interconnect structure, and an adhesive bonding layer disposed over the conductive layer. The semiconductor chip further comprises a III-V IC comprising an array of III-V semiconductor pillars and an array of III-V fences, wherein the III-V fences are laterally spaced apart from the III-V semiconductor pillars, an oxidation layer co-planar with upper and lower surfaces of the III-V semiconductor pillars and the III-V fences, and wherein a first sidewall of the III-V fence has a non-perpendicular edge that directly contacts a sidewall of the oxidation layer having a conforming non-perpendicular edge. The semiconductor ship further comprises first and second eutectic bonding regions disposed directly under the III-V semiconductor pillars and the III-V fences, respectively, the first and second eutectic bonding regions joining base portions of the III-V semiconductor pillars and the III-V fences to the adhesive bonding layer, and wherein the second eutectic bonding region is underneath and in direct contact with an oxidation region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a silicon carrier wafer having a first face and a second face, wherein an epitaxial III-V semiconductor region and an oxide region are disposed on the first face and have substantially equal heights as measured from the first face of the silicon carrier wafer, and wherein a sidewall of the epitaxial III-V semiconductor region contacts a sidewall of the oxide region;

forming a eutectic bonding layer over a top surface of the epitaxial III-V semiconductor region and the oxide region;

bonding a CMOS wafer to the eutectic bonding layer;

removing the silicon carrier wafer after the bonding of the CMOS wafer to the eutectic bonding layer; and singulating the CMOS wafer to form a plurality of three-dimensional integrated circuits (3DICs), wherein each 3DIC includes a CMOS substrate corresponding to a portion of the CMOS wafer and a semiconductor pillar corresponding to a portion of the epitaxial III-V semiconductor region.

2. The method of claim 1, wherein providing the silicon carrier wafer comprises:

growing an oxide layer over the first face of the silicon carrier wafer, wherein the oxide layer comprises a first oxide layer height as measured from the first face of the silicon carrier wafer;

selectively patterning and etching the oxide layer to establish an oxide region and trenches extending to an upper surface of the silicon carrier wafer, wherein the trenches create exposed regions on the upper surface of the silicon carrier wafer, and wherein the trenches form sidewalls of the oxide region;

selectively growing an epitaxial III-V semiconductor layer on the exposed regions, wherein the epitaxial III-V semiconductor layer corresponds to the III-V semiconductor region and spans a width of the trenches and is at least partially in contact with the sidewall of the oxide region, and wherein a mid-span height of the epitaxial III-V semiconductor layer is substantially equal to the first oxide layer height.

3. The method of claim 2, wherein the growing of the epitaxial III-V semiconductor layer forms a lower EPI sidewall having a first height as measured from the first face of the silicon carrier wafer and wherein the lower EPI sidewall is in contact with the sidewall of the oxide region, and an upper EPI sidewall having a second height that extends from the first height to a mid-span height of the epitaxial III-V semiconductor layer, and wherein the upper EPI sidewall is spaced from the sidewall of the oxide layer.

4. The method of claim 3, wherein the upper EPI sidewall has top corners that border the sidewalls of the oxide region, and wherein the top corners have a cross-sectional profile that is rounded, angled, or faceted.

5. The method of claim 1, wherein the CMOS wafer comprises:

a monocrystalline silicon substrate comprising semiconductor devices;

interconnect layers disposed above the monocrystalline silicon substrate and electrically coupled to the semiconductor devices;

contacts disposed above the interconnect layers and electrically coupled to the interconnect layers;

a conductive layer disposed above and electrically coupled to the contacts; and an adhesive bonding layer disposed above and in direct contact with the conductive layer.

6. The method of claim 5, wherein after the removing of the silicon carrier wafer, selectively patterning and etching the epitaxial III-V semiconductor region to form trenches extending to an upper surface of the eutectic bonding layer, wherein the trenches define spaced apart III-V semiconductor pillars with mesa top surfaces and with mesa sidewalls, and wherein the trenches expose open regions on an upper surface of the eutectic bonding layer and adjacent to the III-V semiconductor pillars;

forming a conformal coating on the mesa top surfaces, the mesa sidewalls, and the open regions; and subjecting the conformal coating to a vertical etch-back process preferentially removing the conformal coating from the mesa top surfaces and the open regions to leave spacers covering a sidewall of III-V semiconductor pillars.

7. The method of claim 6 wherein the forming of the 3DICs comprises forming conductive pads and vias comprising:

forming conductive pads on the mesa top surfaces, wherein a conductive pad comprises a top surface and a conductive pad height as measured from a top surface of the conductive layer;

vertically etching through the eutectic bonding layer and the adhesive bonding layer and stopping at an upper surface of the conductive layer, and leaving spaced apart pedestals of the eutectic bonding layer and the adhesive bonding layer directly beneath the III-V semiconductor pillars;

forming a via mask and etching the via mask to form via trenches spaced apart from and between the III-V semiconductor pillars and positioned above a vertical projection of a top surface of the contacts, and extending down to the upper surface of the conductive layer, and extending up to a via trench height that exceeds the conductive pad height;

depositing metal to fill the via trenches and to form vias electrically coupled to the conductive layer; and performing a CMP process to a via height, wherein the via height that is less than the via trench height and greater than the conductive pad height.

8. The method of claim 7, wherein the conductive pad has a smaller surface area than a surface area of the mesa top surface.

9. The method of claim 8 wherein forming of the 3DICs comprises forming a redistribution layer comprising:

vertically etching through the conductive layer and stopping at an upper surface of the CMOS wafer, to electrically isolate the vias from adjacent regions of the conductive layer;

forming a protective layer that fills between neighboring III-V semiconductor pillars and vias and extends to a height that exceeds the conductive pad height;

forming a second mask over the protective layer, and with the second mask in place etching the protective layer to form vertical connection trenches that expose the top surface of the conductive pads, and to form horizontal connection trenches that connect the vertical trenches to the vias, wherein the horizontal connection trenches comprise an upper surface height and a lower surface height;

depositing metal to fill the vertical and horizontal connecting trenches, and performing a CMP process to a height that is between the upper and lower surface heights of the horizontal trench to form electrical connections between the III-V semiconductor pillars and the semiconductor devices of the CMOS wafer.

10. The method of claim 1, wherein providing the silicon carrier wafer comprises:

growing an epitaxial III-V semiconductor layer over the first face of a silicon carrier wafer, wherein the epitaxial III-V semiconductor layer comprises an EPI layer height;

selectively patterning and etching the epitaxial III-V semiconductor layer to establish the epitaxial III-V semiconductor region and to establish trenches extending to an upper surface of the silicon carrier wafer, wherein the trenches create exposed regions on the upper surface of the silicon carrier wafer, and wherein the trenches create sidewalls of the epitaxial III-V semiconductor region; and selectively growing an oxide layer on the exposed regions, wherein the oxide layer corresponds to the oxide region and spans a width of the trenches and is at least partially in contact with the sidewall of the epitaxial III-V semiconductor region, and wherein a mid-span height of the oxide layer is substantially equal to the EPI layer height.

11. The method of claim 2, wherein prior to forming of the eutectic bonding layer, a second oxide layer is deposited or grown above the oxide region and above the epitaxial III-V semiconductor region, and wherein the second oxide layer is subsequently planarized by chemical or mechanical machining to a reduced height that is less than the first oxide layer height.

12. The method of claim 1, wherein the bonding of the CMOS wafer comprises:

forming a first alignment indicator on the CMOS wafer, wherein the CMOS wafer comprises first die regions, first scribe regions, and first edge regions, and wherein the first alignment indicator is formed within the first scribe or the first edge regions and not within the first die regions; and forming a second alignment indicator on the silicon carrier wafer, wherein the silicon carrier wafer comprises second die regions, second scribe regions, second edge regions, and wherein the second alignment indicator is formed within the second scribe or second edge regions and not within the second die regions, and wherein the first and second alignment indicators facilitate alignment of the CMOS wafer and the silicon carrier wafer for bonding.

13. A semiconductor chip comprising:

a CMOS IC comprising a plurality of semiconductor devices, an interconnect structure disposed over and electrically coupled to the semiconductor devices, and an adhesive bonding layer disposed above the interconnect structure;

a III-V IC comprising an array of III-V semiconductor pillars, and a eutectic bonding layer which bonds base portions of the III-V semiconductor pillars to the adhesive bonding layer, wherein a protective layer extends partially over an upper surface of a III-V semiconductor pillar and fills trenches between neighboring pillars to contact an upper surface of the interconnect structure; and wherein a conductive redistribution structure is arranged in the trenches to electrically couple an upper surface of the III-V semiconductor pillar to a contact pad in the interconnect structure, the conductive redistribution structure leaving an opening overtop the III-V semiconductor pillar to allow light to be transmitted from upper surface of the III-V semiconductor pillar.

14. The semiconductor chip of claim 13, wherein the III-V IC also comprises an array of III-V fences laterally spaced apart from the III-V semiconductor pillars, an oxidation layer that has upper and lower surfaces that are co-planar with upper and lower surfaces of the III-V semiconductor pillars and the III-V fences, and wherein a first sidewall of the III-V fence directly contacts a neighboring sidewall of the oxidation layer.

15. The semiconductor chip of claim 14, wherein the sidewalls of the III-V semiconductor pillar, and a second sidewall of the III-V fence, are covered by a dielectric spacer.

16. The semiconductor chip of claim 14, wherein the first sidewall of the III-V fence comprises an upper segment and a lower segment, wherein a top edge of the upper segment is laterally spaced apart from a top edge of a second sidewall of the III-V fence by a first distance, and wherein the upper segment extends vertically down to a height that is less than a second distance between the upper and lower surfaces of the oxidation layer, and wherein the lower segment extends with a rounded, tapered, or faceted profile from a lower point of the upper segment down to the lower surface of the oxidation layer, and a bottom edge of the lower segment is laterally spaced from a bottom edge of the first sidewall by a third distance that is less than the first distance.

17. The semiconductor chip of claim 13 wherein the eutectic bonding layer comprises copper, gold, tin, or zinc, and wherein a barrier layer is disposed over the eutectic bonding layer, and wherein the barrier layer comprises titanium, nitrogen and/or tantalum.

18. The semiconductor chip of claim 13, wherein the III-V semiconductor pillar comprises a conductive pad with a lower surface which is disposed over and electrically coupled to a portion of a top surface of a III-V region, and wherein an upper surface of the conductive pad is electrically coupled to the conductive redistribution structure.

19. The semiconductor chip of claim 18, wherein the lower surface of the conductive pad comprises a pad footprint area in contact with a top surface area of the III-V semiconductor pillar, and wherein the top surface area is greater than the pad footprint area, and wherein the opening is comprised of the top surface area minus a sum of the pad footprint area plus a redistribution structure area that overlaps a vertical projection of the top surface area.

20. A semiconductor chip comprising:

a CMOS IC comprising a plurality of semiconductor devices, an interconnect structure disposed over and electrically coupled to the semiconductor devices, a conductive layer disposed over the interconnect structure, and an adhesive bonding layer disposed over the conductive layer;

a III-V IC comprising:

an array of III-V semiconductor pillars and an array of III-V fences, wherein the III-V fences are laterally spaced apart from the III-V semiconductor pillars;

an oxidation layer co-planar with upper and lower surfaces of the III-V semiconductor pillars and the III-V fences, and wherein a first sidewall of the III-V fence has a non-perpendicular edge that directly contacts a sidewall of the oxidation layer having a conforming non-perpendicular edge;

first and second eutectic bonding regions disposed directly under the III-V semiconductor pillars and the III-V fences, respectively, the first and second eutectic bonding regions joining base portions of the III-V semiconductor pillars and the III-V fences to the adhesive bonding layer, and wherein the second eutectic bonding region is underneath and in direct contact with an oxidation region.

* * * * *